(12) United States Patent
Yamagishi et al.

(10) Patent No.: US 6,516,186 B1
(45) Date of Patent: Feb. 4, 2003

(54) IMAGE-REJECTION RECEIVER

(75) Inventors: Akihiro Yamagishi, Kanagawa (JP); Tsuneo Tsukahara, Kanagawa (JP); Mitsuru Harada, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/401,803

(22) Filed: Sep. 22, 1999

(30) Foreign Application Priority Data

Oct. 2, 1998 (JP) .......................................... 10-280706

(51) Int. Cl.[7] .................................................. A04B 1/10
(52) U.S. Cl. ........................................ 455/302; 455/285
(58) Field of Search .............................. 455/283, 284, 455/285, 302, 304, 296, 311, 295

(56) References Cited

U.S. PATENT DOCUMENTS 6,304,751 B1 * 10/2001 King .......................... 375/350
6,356,747 B1 * 3/2002 Miquel et al. ............... 455/304

OTHER PUBLICATIONS

"Microwave Circuit Technology for Personal Handy–Phone Systems", Muraguchi et al, *NTT R & D*, vol. 44, No. 9, 1995, pp. 69–74.

"A 1.9–GHz Wide–Band IF Double Conversion CMOS Receiver for Cordless Telephone Applications", Rudell et al, *IEEE Journal of Solid–State Circuits*, vol. 32, No. 12, Dec. 1997, pp. 2071–2087.

* cited by examiner

*Primary Examiner*—William Cumming
*Assistant Examiner*—Nick Corsaro
(74) *Attorney, Agent, or Firm*—Arent Fox Kintner Plotkin & Kahn, PLLC

(57) ABSTRACT

In an image-rejection receiver having a first frequency conversion stage (1, 2, 9) having a pair of frequency mixers (1,2) each supplied external radio frequency signal (RF) and first local frequency signal (LOCAL1) with quadrature phase relations (9), a second frequency conversion stage (3–6, 10) having two pairs of frequency mixers (3–4, 5–6) at each output of each first stage mixer and second local frequency signal (LOCAL2) with quadrature phase relations (10), and an adder (7) and a subtractor (8) for providing sum and difference of amplitude of outputs of said second frequency conversion stage to provide inphase component (BBI) and quadrature-phase component (BBQ), no filter is used for removing an undesirable image signal which is generated in frequency conversion. A control circuit (11) is provided to keep accurate quadrature phase relations for said first local frequency signal, and said second local frequency signal, by measuring D.C. component of a product of outputs of two of mixers.

10 Claims, 11 Drawing Sheets

IMAGE-REJECTION RECEIVER

BACKGROUND OF THE INVENTION

The present invention relates to an image-rejection receiver which is used, for instance, in digital radio communication.

FIG. 9 is a prior digital radio receiver which is a super heterodyne receiver, and is now popularly used. In FIG. 9, a first mixer 51 converts received radio frequency RF into intermediate frequency by using a first local frequency LOCAL1. The intermediate frequency passes a narrow band filter 52 for channel selection. The numeral 53 is a quadrature demodulator which converts the intermediate frequency signal into base band signal which has in-phase component BBI and quadrature-phase component BBQ.

The receiver of FIG. 9 has the disadvantage because of the presence of the filter 52. When we intend to mount all the components of a receiver in a single integrated circuit, it is difficult to implement a filter in an integrated circuit.

FIG. 10 is another prior image-rejection receiver which has no narrow band filter in an intermediate frequency stage, and is suitable for a single chip LSI (large scale integrated circuit).

In FIG. 10, the numerals 1–6 show a frequency mixer, 7 is a subtractor, 8 is an adder, 54 and 55 are a 90° phase shifter. The structure of FIG. 10 can cancel an upconvert component generated in a second stage mixer (3–6) by using the phase relations of an upconvert component and a downconvert component. Therefore, no filter in an intermediate frequency stage is requested for rejecting an image frequency which would be the same frequency as the desired frequency on baseband. Therefore, the channel selection on baseband is possible in the structure of FIG. 10.

The operation of FIG. 10 is as follows.

It is assumed that receive frequency is expressed as $\cos(w_r t)$, and first local signal in quadrature relations are $\cos(w_1 t)$ and $\sin(w_1 t)$, respectively.

Outputs I and Q of the first mixer (1, 2) are;

$$I=(1/2)[\cos(w_r+w_1)t+\cos(w_r-w_1)t] \quad (1)$$

$$Q=(1/2)[\sin(w_r+w_1)t-\sin(w_r-w_1)t] \quad (2)$$

The frequency component $(w_r+w_1)$ is very high frequency, and is eliminated by using a simple filter. Therefore, only the frequency component $(w_r-w_1)$ is applied to the second mixers (3–6).

When we assume that second local signal LOCAL2 applied to the second mixers 3 and 6 is $\cos(w_2 t)$, and second local signal applied to the second mixers 4 and 5 is $\sin(w_2 t)$, the outputs II, IQ, QQ and QI of the mixers 3 through 6 are expressed as follows.

$$II=(1/4)[\cos(w_r-w_1+w_2)t+\cos(w_r-w_1-w_2)t] \quad (3)$$

$$IQ=(1/4)[\sin(w_r-w_1+w_2)t-\sin(w_r-w_1-w_2)t] \quad (4)$$

$$QQ=(1/4)[\cos(w_r-w_1+w_2)t-\cos(w_r-w_1-w_2)t] \quad (5)$$

$$QI=-(1/4)[\sin(w_r-w_1+w_2)t+\sin(w_r-w_1-w_2)t] \quad (6)$$

Accordingly, the baseband outputs BBI and BBQ are as follows.

$$BBI=(1/2)\cos(w_r-w_1-w_2)t \quad (7)$$

$$BBQ=-(1/2)\sin(w_r-w_1-w_2)t \quad (8)$$

Therefore, it should be noted that an image frequency $$(w_r-w_1+w_2) \quad (9)$$

is eliminated in the baseband.

In FIG. 10, a pair of local frequencies (sine signal, and cosine signal) are generated by using 90° phase shifters 54 and 55. When the phase difference obtained by the 90° phase shifter is not accurately 90°, an image signal is not completely eliminated, but is superposed on a desired signal on baseband. This image signal can not be eliminated by using a filter.

In particular, the first local frequency is very high frequency, and it is difficult to provide an ideal accurate 90° phase shifter. When the first local signal is not ideal, a pair of quadrature local frequencies are expressed by $\cos(w_1 t)$ and $\sin(w_1 t+\emptyset)$, where $\emptyset$ is phase error.

When the phase error is not zero, the above equations (3) through (6) are modified as follows, respectively.

$$II=(1/4)[\cos(w_r-w_1+w_2)t+\cos(w_r-w_1-w_2)t] \quad (10)$$

$$IQ=(1/4)[\sin(w_r-w_1+w_2)t-\sin(w_r-w_1-w_2)t] \quad (11)$$

$$QQ=(1/4)[\cos((w_r-w_1+w_2)t-\emptyset)-\cos((w_r-w_1-w_2)t-\emptyset)] \quad (12)$$

$$QI=-(1/4)[\sin((w_r-w_1+w_2)t-\emptyset)+\sin((w_r-w_1-w_2)t-\emptyset)] \quad (13)$$

Accordingly, the equations (7) and (8) are modified as follows.

$$BBI=(1/2)\cos((w_r-w_1-w_2)t-\emptyset/2)\cos(\emptyset/2)-(1/2)\sin((w_r-w_1-w_2)t-\emptyset/2)\sin(\emptyset/2) \quad (14)$$

$$BBQ=(1/2)\sin((w_r-w_1-w_2)t-\emptyset/2)\cos(\emptyset/2)+(1/2)\cos((w_r-w_1-w_2)t-\emptyset/2)\sin(\emptyset/2) \quad (15)$$

Therefore, when an undesired radio frequency $w_{ri}$ of the frequency satisfying $(w_{ri}-w_1+w_2)=(w_r-w_1-w_2)$ is superposed to a desired frequency $w_r$ emerging the baseband frequency $(w_r-w_1-w_2)$, it is impossible to separate the undesired radio frequency signal. This deteriorates receive sensitivity.

The above analysis considers an only phase error in the first local signal. Indeed, the second local signal may also have a phase error, and this causes further degradation of receive sensitivity.

Further, when the outputs II and QQ (or IQ and QI) of the second mixer have amplitude difference from each other, that difference affects to an output of the subtractor 7 and/or the adder 8, and an image signal can not be eliminated. Assuming that an amplitude of QQ or QI is A when an amplitude of II or IQ is 1, the ratio IR of an image signal to a desired signal is expressed as follows.

$$IR=10 \log[(1+A^2-2A\cos\emptyset)/(1+A^2+2A\cos\emptyset)]$$

SUMMARY OF THE INVENTION

It is an object, therefore, of the present invention to provide a new and improved image-rejection receiver by overcoming the disadvantages and limitations of a prior image-rejection receiver.

It is also an object of the present invention to provide an image-rejection receiver which cancels an image signal completely.

The above and other objects are attained by an image-rejection receiver comprising; a first mixer receiving an input radio frequency signal and a first local frequency signal to provide sum and difference frequencies of those signals; a second mixer receiving said input radio frequency signal and said first local frequency signal through a first variable phase shifter which shifts phase of said first local frequency signal by 90° to provide sum and difference frequencies of those signals; a third mixer receiving an output of said first mixer and a second local frequency signal to provide sum and difference frequencies of those signals; a fourth mixer receiving said output of said first mixer and output of said second local frequency signal through a second variable phase shifter which shifts phase of said second local signal by 90° to provide sum and difference frequencies of those signals; a fifth mixer receiving an output of said second mixer and said output of said second variable phase shifter to provide sum and difference frequencies of those signals; a sixth mixer receiving said output of said second mixer and said second local frequency signal to provide sum and difference frequencies of those signals; a subtractor for providing difference between amplitude of an output of said third mixer and amplitude of an output of said fifth mixer as inphase component BBI; an adder for providing sum of amplitude of an output of said fourth mixer and amplitude of an output of said sixth mixer as quadrature-phase component BBQ; and a control circuit receiving at least three of outputs of said 3'rd through 6'th mixers to provide a control signal of said first variable phase shifter and said second variable phase shifter so that phase shift by said phase shifters is controlled to be 90°.

Preferably, said control circuit provides a control signal of said first variable phase shifter by D.C. component of a product of outputs of said third mixer and said sixth mixer, and a control signal of said second variable phase shifter by D.C. component of a product of outputs of said third mixer and said fourth mixer.

According to another feature of the present invention, an image-rejection receiver comprises; a first mixer receiving an input radio frequency signal and a first local frequency signal to provide sum and difference frequencies of those signals; a second mixer receiving said input radio frequency signal and said first local frequency signal through a first phase shifter which shifts phase of said first local frequency signal by 90° to provide sum and difference frequencies of those signals; a third mixer receiving an output of said first mixer and a phased second local frequency signal to provide sum and difference frequencies of those signals; a fourth mixer receiving said output of said first mixer and a phased second local frequency signal to provide sum and difference frequencies of those signals; a fifth mixer receiving an output of said second mixer and a phased second local frequency to provide sum and difference frequencies of those signals; a sixth mixer receiving said output of said second mixer and a phased second local frequency to provide sum and difference frequencies of those signals; a subtractor for providing difference between amplitude of an output of said third mixer and amplitude of an output of said fifth mixer as inphase component BBI; an adder for providing sum of amplitude of an output of said fourth mixer and amplitude of an output of said sixth mixer as quadrature-phase component BBQ; a phase set circuit receiving a second local frequency signal and shifting phase of said second local frequency signal to provide phased second local frequencies to said third, fourth, fifth and sixth mixers; and a control circuit receiving an output of said 3'rd through 6'th mixers to measure phase error of said first phase shifter from 90° and phases of said phased second local frequency signals supplied by said phase set circuit, and to provide a control signal to said phase set circuit so that the phased second local frequencies are supplied to said 3'rd through 6'th mixers to compensate the phase error of said first phase shifter from 90°.

Preferably, said phase set circuit provides second local frequency signal with no phase shift to said third mixer and said sixth mixer, has a second variable phase shifter for providing 90° phase shifted second local frequency signal to said fourth mixer, and a third variable phase shifter for providing 90° phase shifted second local frequency signal to said fifth mixer, and said control circuit controls said second variable phase shifter so that amount of phase error from 90° of said second variable phase shifter is equal to an amount of phase error from 90° of said first phase shifter but in opposite sign, and phase error from 90° of said third variable phase shifter is equal to phase error from 90° of said first phase shifter.

Preferably, said control circuit measures phase error from 90° of said first phase shifter by D.C. component of a product of outputs of said third mixer and said sixth mixer, phase error from 90° of said second variable phase shifter by D.C. component of a product of outputs of said third mixer and said fourth mixer, and phase error from 90° of said third variable phase shifter by D.C. component of a product of outputs of said fifth mixer and said sixth mixer.

Preferably, said phase set circuit provides second local frequency signal with no phase shift to said third mixer and said sixth mixer, has a second variable phase shifter for providing 90° phase shifted second local frequency signal, a third phase shifter coupled with an output of said second variable phase shifter to provide a phased second local frequency signal to said fourth mixer, and a fourth variable phase shifter coupled with an output of said second variable phase shifter to provide a phased second local frequency signal to said fifth mixer; and said control circuit controls said second variable phase shifter so that phase error from 90° of said second variable phase shifter is zero, an amount of phase error from 0° of said third variable phase shifter is equal to an amount of phase error from 90° of said first phase shifter but in opposite sign, and phase error from 0° of said fourth variable phase shifter is equal to phase error from 90° of said first phase shifter.

Preferably, said control circuit measures phase error from 90° of said second variable phase shifter by D.C. component of a product of outputs of said third mixer and said fourth mixer assuming that phase shift by said third variable phase shifter and said fourth variable phase shifter is zero, phase error from 90° of said third variable phase shifter by D.C. component of a product of outputs of said third mixer and said sixth mixer, and phase error of said fourth variable phase shifter by D.C. component of a product of outputs of said fifth mixer and said sixth mixer.

Preferably, said phase set circuit provides second local frequency signal with no phase shift to said third mixer, has a second variable phase shifter for providing 90° phase shifted second local frequency signal to said fourth mixer, a third variable phase shifter to provide a phased second local frequency signal to said sixth mixer, and a fourth variable phase shifter coupled with an output of said second variable phase shifter to provide a phased second local frequency signal to said fifth mixer; said control circuit controls said second variable phase shifter so that phase error from 90° of said second variable phase shifter is zero, and phase error from 0° of said third variable phase shifter and said fourth variable phase shifter is equal to phase error from 90° of said first phase shifter.

Preferably, said control circuit measures phase error from 90° of said second variable phase shifter by D.C. component of a product of outputs of said third mixer and said fourth mixer, and measures phase error from 90° of said first phase shifter and phase error from 0° of said third variable phase shifter and said fourth variable phase shifter by D.C. component of difference of a product of outputs of said third mixer and said sixth mixer, and a product of outputs of said fourth mixer and said fifth mixer.

Still preferably, said image-rejection receiver further comprises a first, a second, a third and a fourth gain controllable amplifiers at an output of said third, fourth, fifth and sixth mixers, respectively, and said control circuit measures amplitudes of said gain controllable amplifiers and controls said gain controllable amplifiers so that amplitude of output signal of said first gain controllable amplifier is the same as that of said third gain controllable amplifier, and amplitude of output signal of said second gain controllable amplifier is the same as that of said fourth gain controllable amplifier.

BRIEF DESCRIPTION OF THE DRAWINGS

The foregoing and other objects, features, and attendant advantages of the present invention will be understood by means of the following description and accompanying drawings wherein.

DETAILED DESCRIPTION OF THE PREFERRED EMBODIMENTS

Figure 1A:
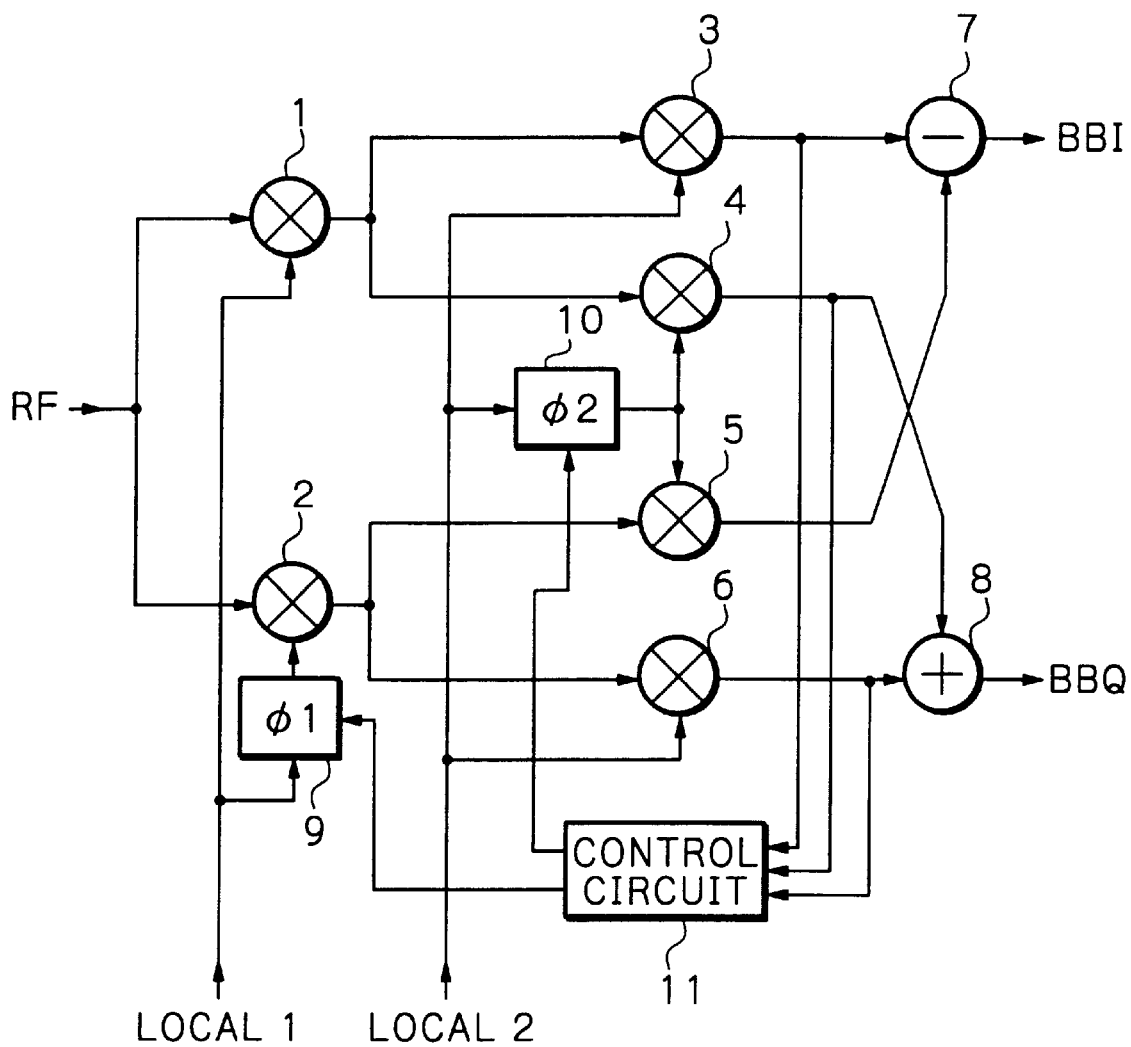
FIG. 1A is a block diagram of an image-rejection receiver according to the present invention.

The compensation of a phase error in a phase shifter is to detect a phase error from 90° and an amplitude error of an output of a phase shifter, and correct the errors.

Two plans are possible to compensate a phase error.

The first plan is to detect a phase error in a first mixer and a phase error in a second mixer so that each error in each mixers is independently compensated, and the resultant final phase error becomes zero.

The second plan is not to compensate an error in a first phase shifter, but to control a second local oscillator so that phased second local signals which can compensate a first phase shifter are applied to the mixers 3'rd through 6'th.

As for the first plan, the phase error $\varnothing$ in the first phase shifter is detected by taking the product II of the equation (10) and QI of the equation (13) as shown in the equation (16), and then, taking the D.C. component of the equation (16) as shown in the equation (17).

$$II \times QI = -(1/32)[\sin(2w_a - \varnothing) + \sin(2w_b - \varnothing) + 2\sin((w_a + w_b)t - \varnothing) - 2\sin\varnothing\cos(w_a - w_b)t - 2\sin\varnothing] \quad (16)$$

$$II \times QI_{DC} = (1/16)\sin\varnothing \quad (17)$$

where $w_a = w_1 + w_2$, $w_b = w_1 - w_2$.

Similarly, the phase error in the second phase shifter from 90° is detected by taking D.C. component of the product of the signals II and IQ.

Therefore, each phase errors are compensated by feedbacking each detected phase error to a respective phase shifter.

As for the second plan, the equations (14) and (15) are modified to the equations (18) and (19), where $\theta_1$, $\theta_2$ and $\theta_3$ are phase errors of the mixers 4, 5 and 6, respectively, from the reference phase which is the phase of the local signal of the mixer 3.

$$BBI = (1/2)\cos((w_r - w_1 - w_2)t - (\varnothing + \theta_2)/2)\cos(\varnothing + \theta_2)/2 - (1/2)\sin((w_r - w_1 - w_2)t - (\varnothing - \theta_2)/2)\sin(\varnothing - \theta_2)/2 \quad (18)$$

$$BBQ = -(1/2)\sin((w_r - w_1 - w_2)t - (\varnothing + \theta_1 + \theta_3)/2)\cos(\varnothing + \theta_1 + \theta_3)/2 + (1/2)\cos((w_r - w_1 + w_2)t - (\varnothing - \theta_1 - \theta_3)/2)\sin(\varnothing + \theta_1 - \theta_3)/2 \quad (19)$$

Two implementations are possible to cancel an image signal based upon the equations (18) and (19).

The first implementation is to modify the equations (18) and (19) to the following equations (20) and (21), where it is assumed that the phase of the local signal applied to the mixer 3 is 0°, the phase of the local signal applied to the mixer 4 is $(90-\varnothing)°$, the phase of the local signal applied to the mixer 5 is $(90+\varnothing)°$, and the phase of the local signal applied to the mixer 6 is 0°, in other words, $\theta_1 = -\varnothing$, $\theta_2 = \varnothing$, $\theta_3 = 0$, $$BBI = (1/2)\cos((w_r - w_1 - w_2)t - \varnothing)\cos\varnothing \quad (20)$$

$$BBQ = -(1/2)\sin((w_r - w_1 - w_2)t)\cos\varnothing \quad (21)$$

In the above equations, the phase of BBI is delayed by $\varnothing$, and the quadrature relation between BBI and BBQ is destroyed, however, it can be compensated by using a compensation circuit ("Degradation and compensation in ¶/4-QPSK delay-detection circuit", Technical report of The Institute of Electronics, Information and Communication Engineers in Japan, RCS92-101).

The second implementation is to modify the equations (18) and (19) to the following equations (22) and (23), where it is assumed that the phase of the local signal applied to the mixer 3 is 0°, the phase of the local signal applied to the mixer 4 is 90°, the phase of the local signal applied to the mixer 5 is $(90+\varnothing)°$, and the phase of the local signal applied to the mixer 6 is $\varnothing°$, in other words, $\theta_1 = 0$, $\theta_2 = \varnothing$, $\theta_3 = \varnothing$.

$$BBI = (1/2)\cos((w_r - w_1 - w_2)t - \varnothing)\cos\varnothing \quad (22)$$

$$BBQ = -(1/2)\sin((w_r - w_1 - w_2)t - \varnothing)\cos\varnothing \quad (23)$$

In the above equations, the signals BBI and BBQ are delayed similarly, and the quadrature relation between those signals is kept.

In each implementations, $\theta_1$, $\theta_2$ and $\theta_3$ are measured as phase error from 90° by taking D.C. component of a product of two signals selected from II, IQ, QQ and QI, therefore, the phase error is compensated by feedbacking one of said signals to a phase shifter.

Similarly, amplitude error may be compensated by gain control amplifiers coupled with an output of the 3'rd through 6'th mixers, measuring amplitude information by amplitude detection of each outputs, and controlling said gain control amplifiers so that the outputs of the same have the same amplitude as one another.

(First Embodiment)

Figure 1B:
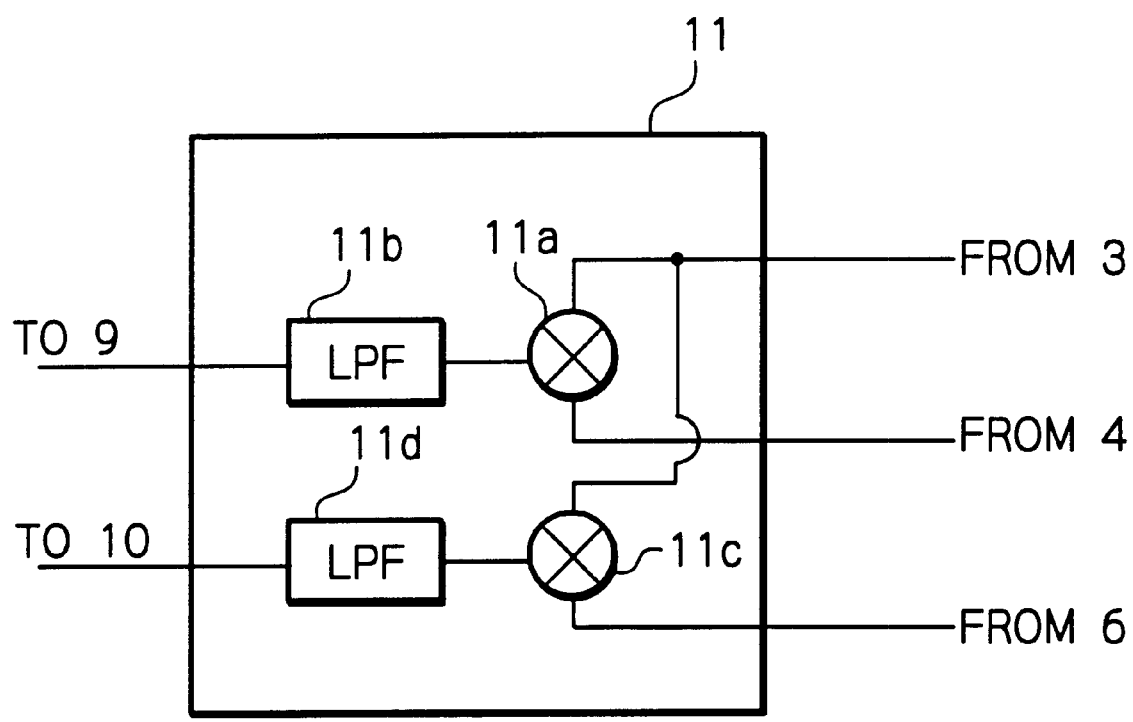
FIG. 1B is a block diagram of a control circuit according to the present invention.

FIG. 1A is a block diagram of an image-rejection receiver according to the present invention, where the numerals 9 and 10 are a variable phase shifter, and FIG. 1B shows a control circuit 11 in FIG. 1A. The phase from 90° of each variable phase shifters is adjustable by a control signal. The numeral 11 is a control circuit, which provides a phase error from 90° of the variable phase shifter 9 by taking D.C. component of the product of outputs of the mixers 3 and 6 as shown in FIG. 1B, and a phase error from 90° of the variable phase shifter 10 by taking D.C. component of the product of outputs of the mixers 3 and 4, as shown in FIG. 1B, where the symbols 11a and 11c are a multiplier, and 11b and 11d are a low pass filter for taking D.C. component.

The variable phase shifters 9 and 10 are controlled so that the measured phase error becomes zero, then, the phase difference of two outputs of each phase shifters becomes 90°.

Therefore, image components of in-phase component BBI and quadrature-phase component BBQ in baseband are cancelled, and only desired component is obtained.

Figure 2:
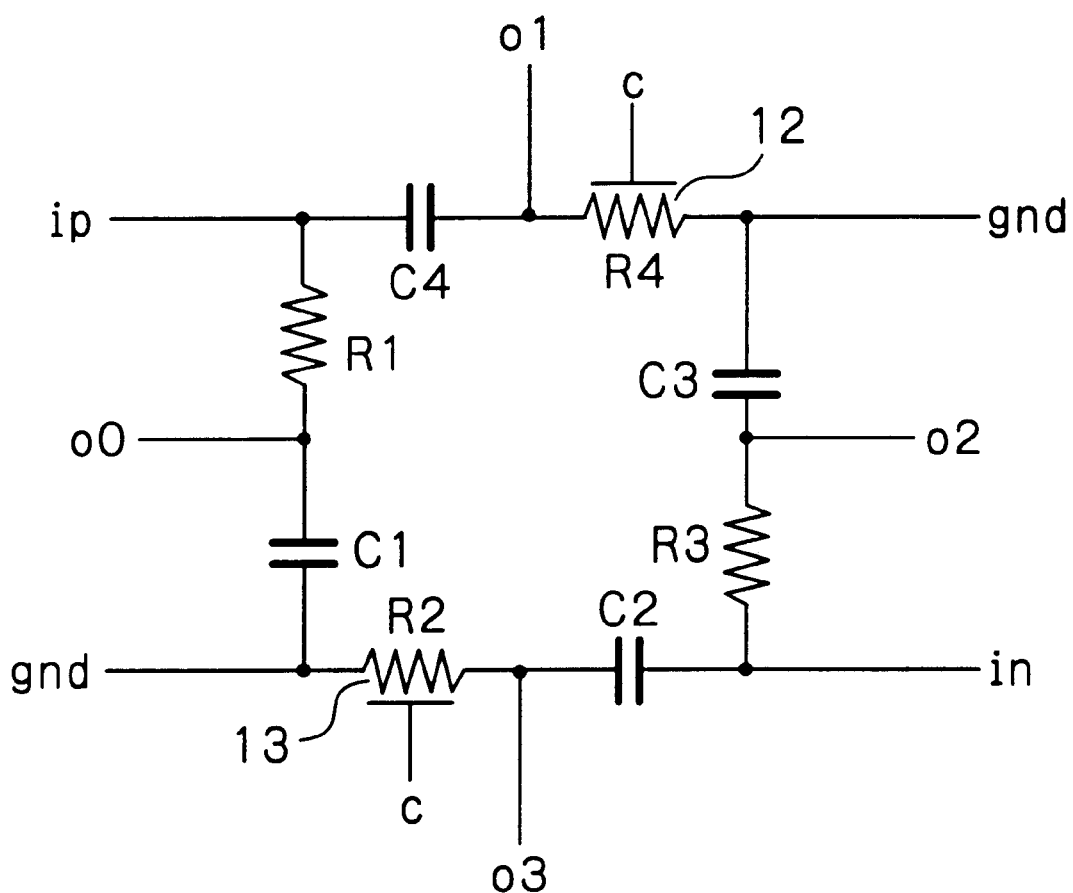
FIG. 2 is a circuit diagram of a variable phase shifter.

FIG. 2 shows a circuit diagram of variable phase shifters 9 and 10. In the figure, the symbols (ip) and (in) are an input terminal receiving positive phase signal and negative phase signal, respectively, of a local signal, (gnd) is a ground terminal, o0, o1, o2 and o3 are an output terminal, C1, C2, C3 and C4 are a capacitor, R1, R2, R3 and R4 are a resistor. When the resistance of each resistors R1, R2, R3 and R4 is the same as one another, the signal phases of output terminals o1, o2, o3 and o4 are 0°, 90°, 180° and 270°, respectively. When the resistors R2 and R4 are variable resistors 12 and 13, respectively, and are controlled simultaneously, the phase of the output terminals o1 and o3 can be controlled while keeping the phase difference between the phase of o1 and o3 to be 180°. When the amount of the phase control is ¢, the phase of output terminals o1, o2, o3 and o4 is 0, 90+¢, 180 and 270+¢, respectively.

(Second Embodiment)

Figure 3:
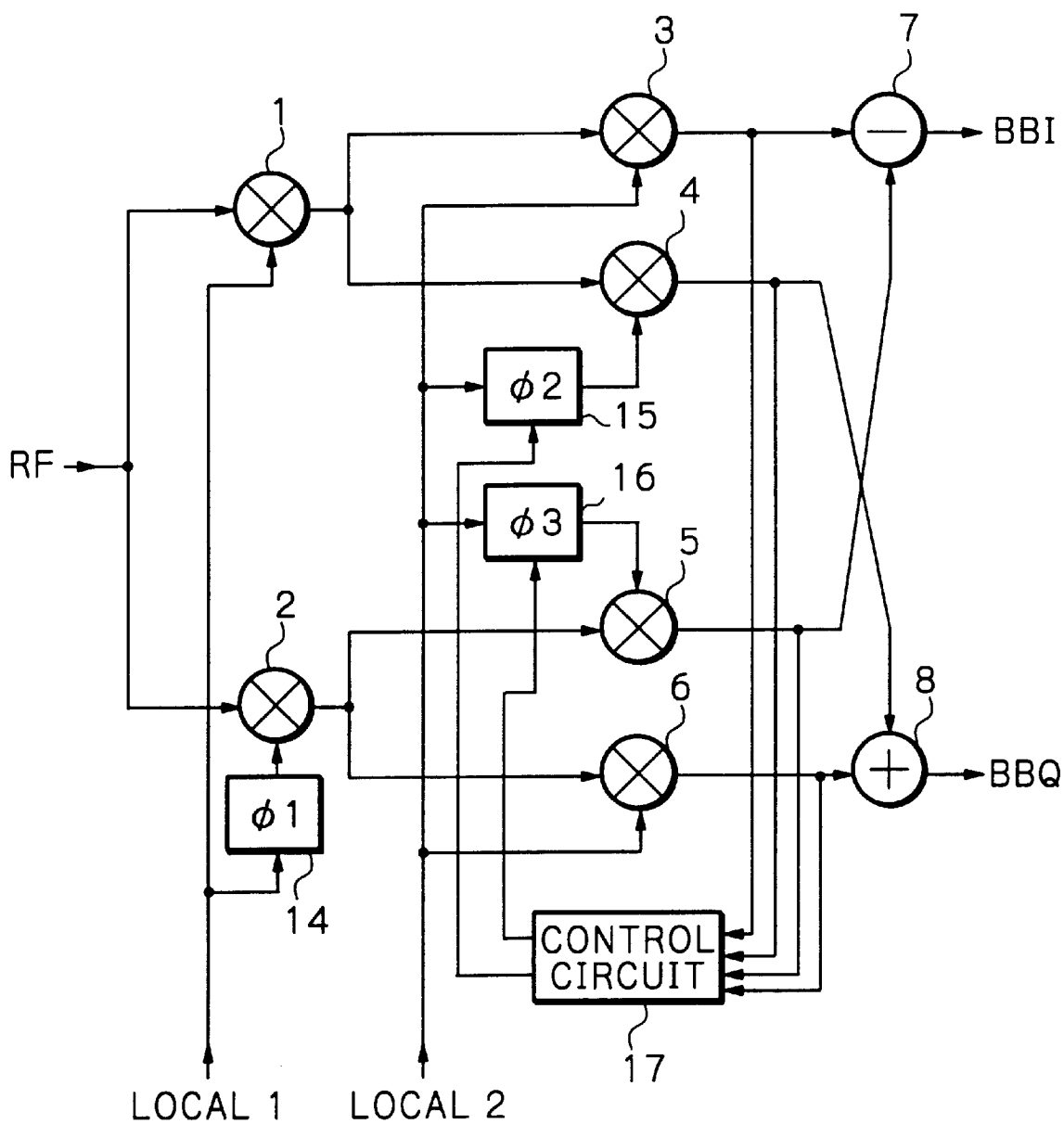
FIG. 3 is a block diagram of another image-rejection receiver according to the present invention.

FIG. 3 is a block diagram of another embodiment of an image-rejection receiver according to the present invention. In the figure, the numerals 15 and 16 are a variable phase shifter which can control output phase around 90° according to an external control signal. The numeral 17 is a control circuit, which measures the phase error Ø from 90° of the phase shifter 14 by taking D.C. component of the product of the outputs of the mixers 3 and 6, the phase error $\theta_1$ from 90° of the phase shifter 15 by taking D.C. component of the product of the outputs of the mixers 3 and 4, and the phase error $\theta_2$ from 90° of the phase shifter 16 by taking D.C. component of the product of the outputs of the mixers 5 and 6. The measured phase errors are applied to the phase shifters so that $\theta_1$ is controlled to –Ø, and $\theta_2$ is controlled to Ø.

Thus, the phases of the second local signal applied to the mixers 3, 4, 5 and 6 are 0°, (90–Ø)°, (90+Ø)°, and 0°, respectively.

Thus, image components of inphase component BBI and quadrature-phase component BBQ are cancelled in baseband, and only desired signal is obtained.

(Third Embodiment)

Figure 4:
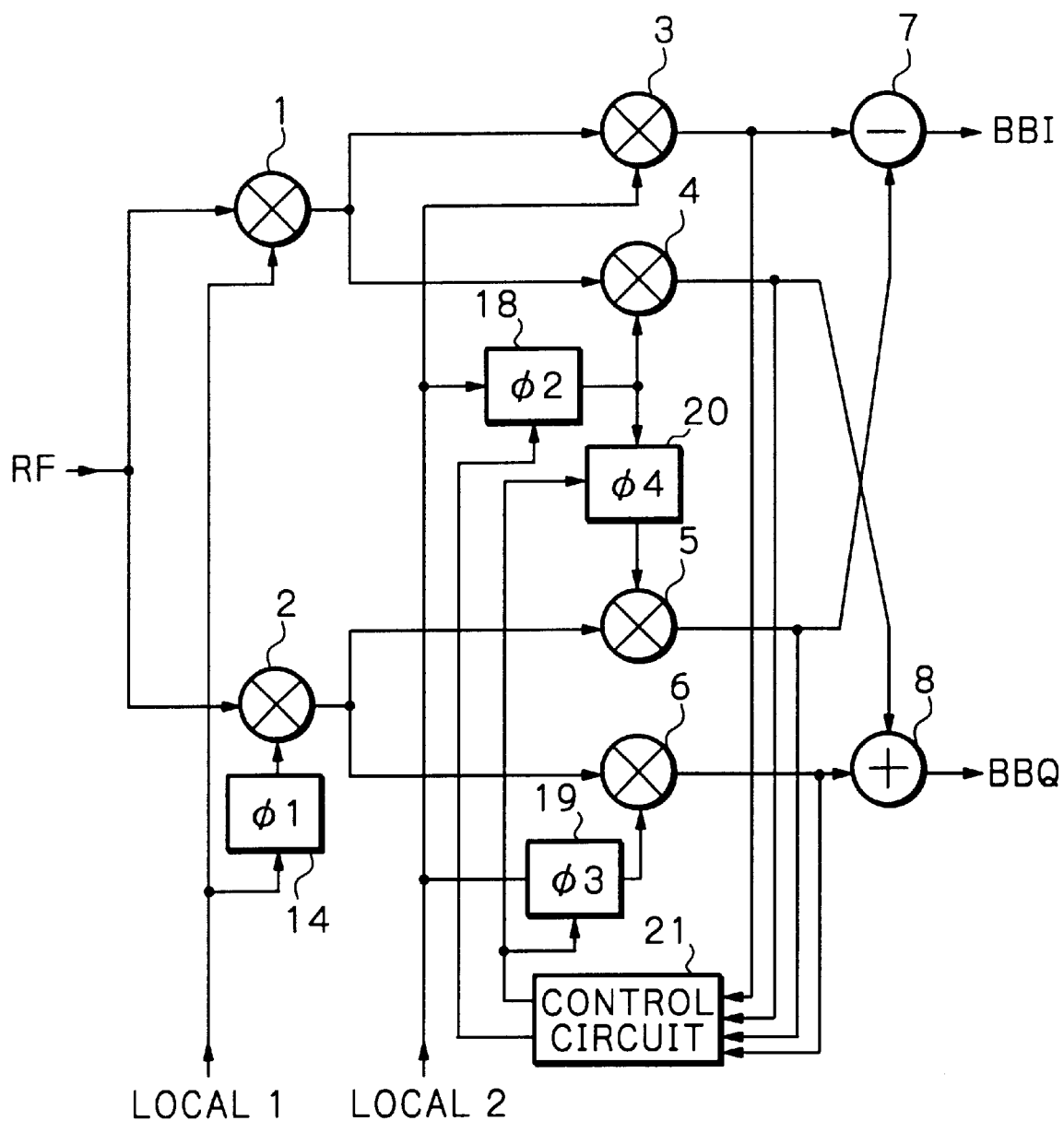
FIG. 4 is a block diagram of still another image-rejection receiver according to the present invention.

FIG. 4 shows a block diagram of still another embodiment of an image-rejection receiver according to the present invention. In the figure, the numeral 18 is a variable phase shifter for controlling phase shift around 90° according to the external control signal, the numerals 19 and 20 are variable phase shifters having the same characteristics as each other for controlling phase shift around 0° according to the external control signal. The variable phase shifters 19 and 20 have the same phase shift as each other by the common control signal.

The numeral 21 is a control circuit which measures the phase error of the phase shifter 18 by the D.C. component of the product of the outputs of the mixers 3 and 4 so that the control signal for cancelling said phase errors is obtained. The control circuit 21 further measures the phase error Ø of the first phase shifter 14 and the phase error of the variable phase shifters 19 and 20 around 0° by the D.C. component of the product of the outputs of the mixers 3 and 6, and the D.C. component of the product of the outputs of the mixers 5 and 4, for cancelling said phase errors.

Therefore, the phase difference between two outputs of the second phase shifter 18 is controlled to be 90°, and the phase shift by the phase shifters 19 and 20 is controlled to be the same as the phase error Ø of the phase shifter 14.

Accordingly, the mixer 3 is supplied the second local signal which has 0° phase, the mixer 4 is supplied the second local signal which has 90° phase, the mixer 5 is supplied the second local signal which has (90+Ø)° phase, and the mixer 6 is supplied the second local signal which has Ø° phase.

Accordingly, the inphase component BBI, and the quadrature-phase component BBQ in the basebase are cancelled as shown in the equations (22) and (23), and only the desired signal is obtained.

(Fourth Embodiment)

Figure 5:
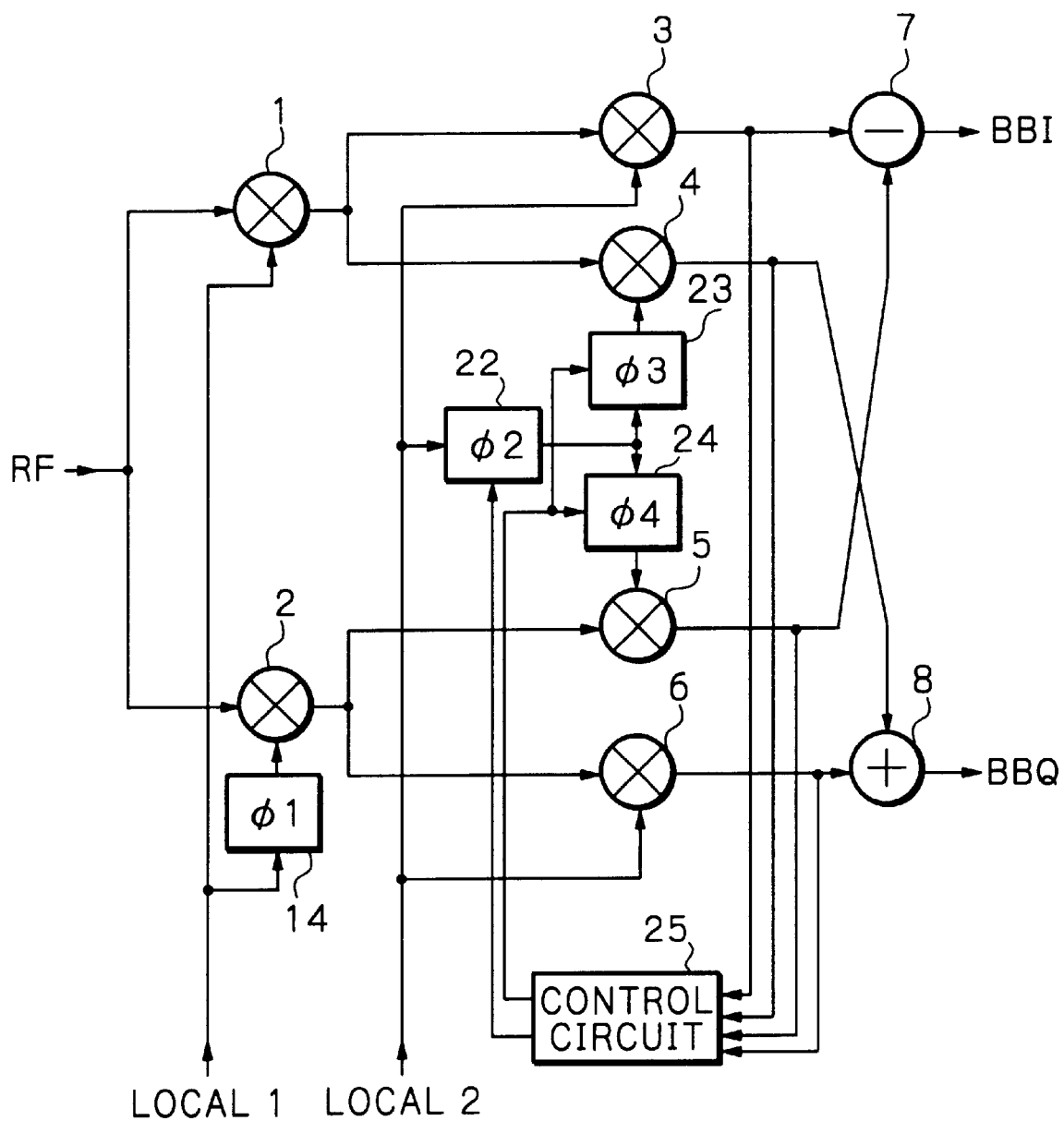
FIG. 5 is a block diagram of still another image-rejection receiver according to the present invention.

FIG. 5 is a block diagram of still another embodiment of an image-rejection receiver according to the present invention. In the figure, the numeral 22 is a first variable phase shifter which controls the phase around 90° according to a control signal, the numerals 23 and 24 are third and fourth variable phase shifters which control the phase around 0° according to the control signal. The variable phase shifters 23 and 24 shift the phases in positive direction and negative direction by the same amount, respectively, by the common control signal.

The numeral 25 is a control circuit, which, first, measures the phase error from 90° of the variable phase shifter 22 by the D.C. component of the product of the outputs of the mixers 3 and 4, and provides the control signal for cancelling said phase error, assuming that the phase shift by the variable phase shifters 23 and 24 is zero. Then, the control circuit 25 compares the phase shift $\theta_3$ of the phase shifter 24 by the D.C. component of the product of the output signals of the mixers 5 and 6, with the phase error Ø from 90° of the phase shifter 14, and provides the control signal for the phase shifters 23 and 24 so that the phase shift $\theta_3$ becomes equal to the phase error Ø.

Thus, the mixer 3 is supplied the second local signal having 0° phase, the mixer 4 is supplied the second local signal having (90–Ø)° phase, the mixer 5 is supplied the second local signal having (90+Ø)° phase, and the mixer 6 is supplied the second local signal having 0° phase.

Therefore, an image component in the inphase component BBI and the quadrature-phase component BBQ in the baseband are cancelled as shown in the equations (20) and (21), and only the desired component is provided.

(Fifth Embodiment)

Figure 6:
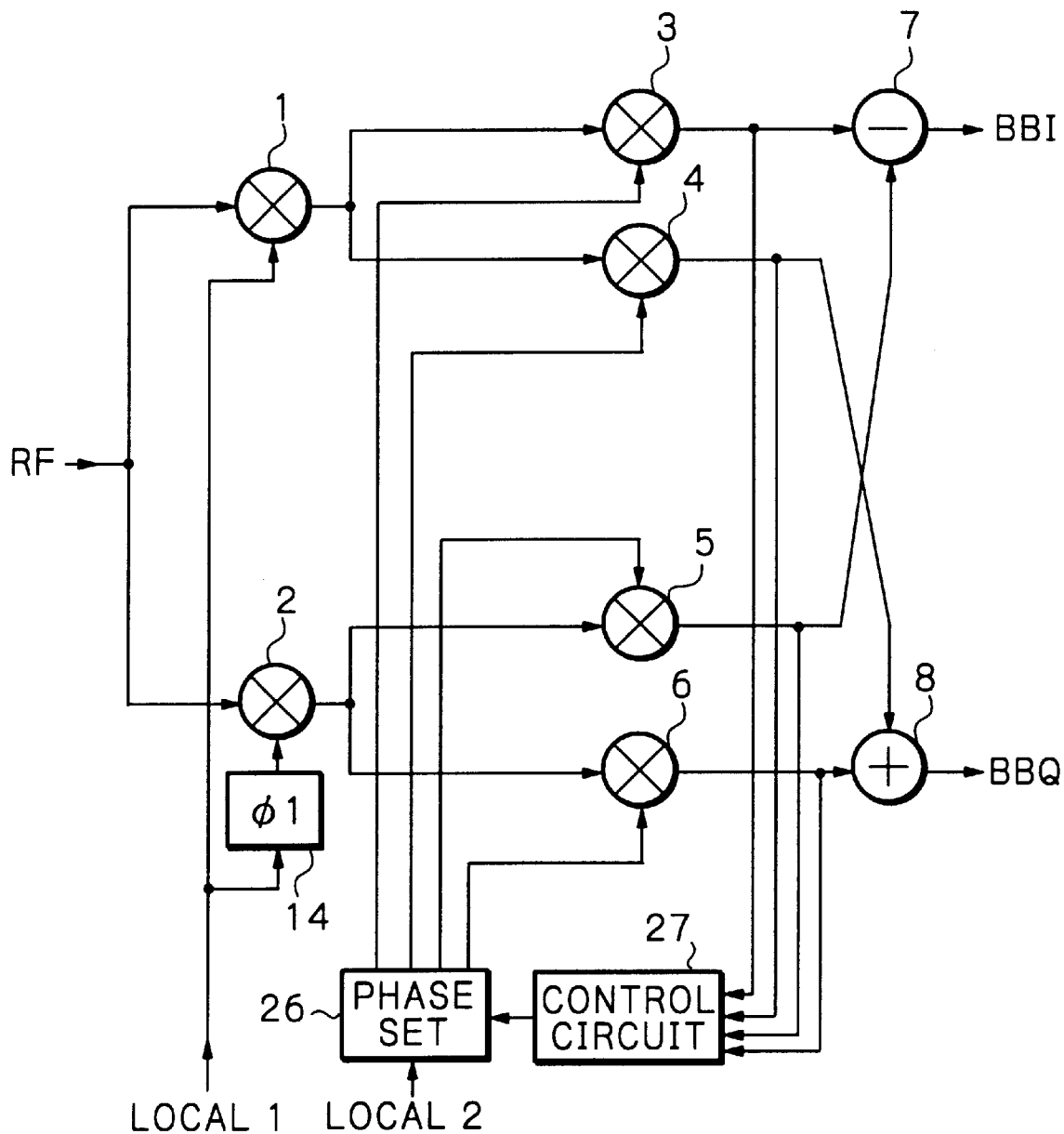
FIG. 6 is a block diagram of still another image-rejection receiver according to the present invention.

FIG. 6 is a block diagram of still another embodiment of an image-rejection receiver according to the present invention. In the figure, the numeral 26 is a phase set circuit. The phase set circuit 26 receives a second local signal LOCAL2, and determines the phases of the second local signal according to a control signal, and distributes the determined phases to each mixers 3 through 6. The phase set circuit 26 is implemented for instance by the circuit of FIG. 7, in which each of variable phase shifters 28 through 32 is implemented for instance by a circuit shown in FIG. 2.

Figure 7:
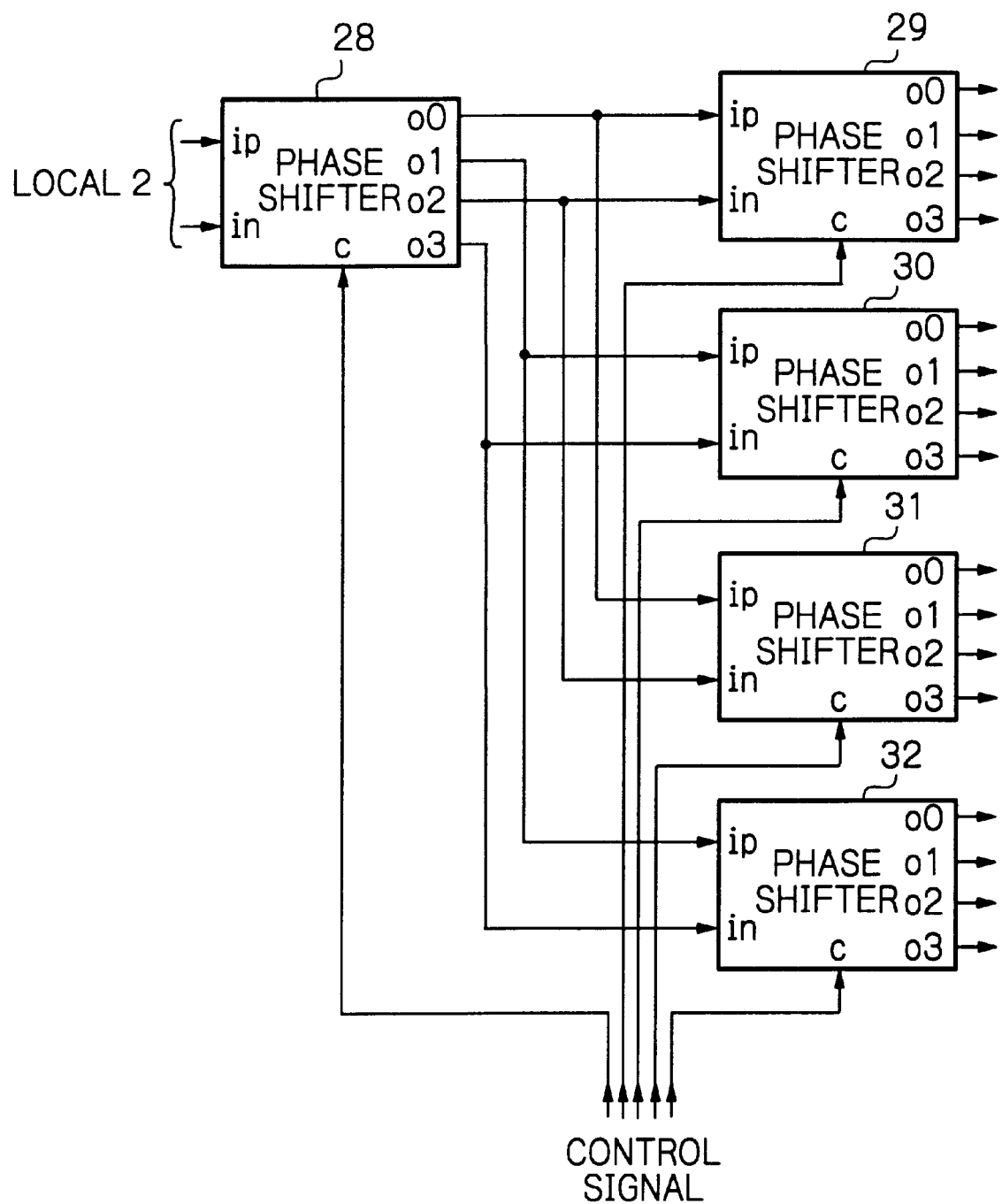
FIG. 7 is a block diagram of a phase set circuit.

Assuming that the phase shift in the variable phase shifter 28 in FIG. 7 is ¢, and the phase shift in the variable phase shifters 29 through 32 is zero, the output terminals o1, o2, o3 and o4 of the variable phase shifter 28 provide the phase signals 0°, (90+¢)°, 180°, and (270+¢)°, respectively. Therefore, the output terminals o0 and o1 of the variable phase shifter 29 provide the phase signals 0° and 90°, respectively, and the output terminals o0 and o3 of the variable phase shifter 30 provide the phase signals (90+¢)°, and (0+¢)°, respectively.

Therefore, the mixers 3, and 4 receive the second local signal with the phase 0 from the output terminal o0, and the phase 90° from the output terminal ol of the variable phase shifter 29, respectively, similarly, the mixers 5 and 6 receive the second local signal with the phase (90+¢)° from the output terminal o0, and the phase (0+¢)° from the output terminal o3 of the variable phase shifter 30, respectively. The phase ¢ is controlled to be equal to the phase error Ø from 90° of the phase shifter 14. Thus, an image-rejection receiver which satisfies the equations (22) and (23) is obtained.

Alternatively, assuming that the phase shift by the variable phase shifter 28 is 0, the phase shift by the variable phase shifters 29 and 30 is ¢2, and the phase shift by the variable phase shifters 31 and 32 is ¢3, the variable phase shifter 29 provides the phase signals 0 and (90+¢2)° at the output terminals o1 and o2, respectively. And, the variable phase shifter 31 provides the phase signal (90+¢3)° at the output terminal o1. In this case, the mixers 3 and 6 receive the second local signal with the phase 0 from the output terminal o1 of the variable phase shifter 29, the mixer 4 receives the second local signal with the phase (90+¢2)° from the output terminal ol of the variable phase shifter 29, and the mixer 5 receives the second local signal with the phase (90+¢3)° from the output terminal o1 of the variable phase shifter 31. The phase errors ¢2 and ¢3 are controlled to be –Ø and Ø, respectively, where Ø is the phase error from 90° of the phase shifter 14. Thus, an image-rejection receiver satisfying the equations (20) and (21) is obtained.

(Sixth Embodiment)

Figure 8:
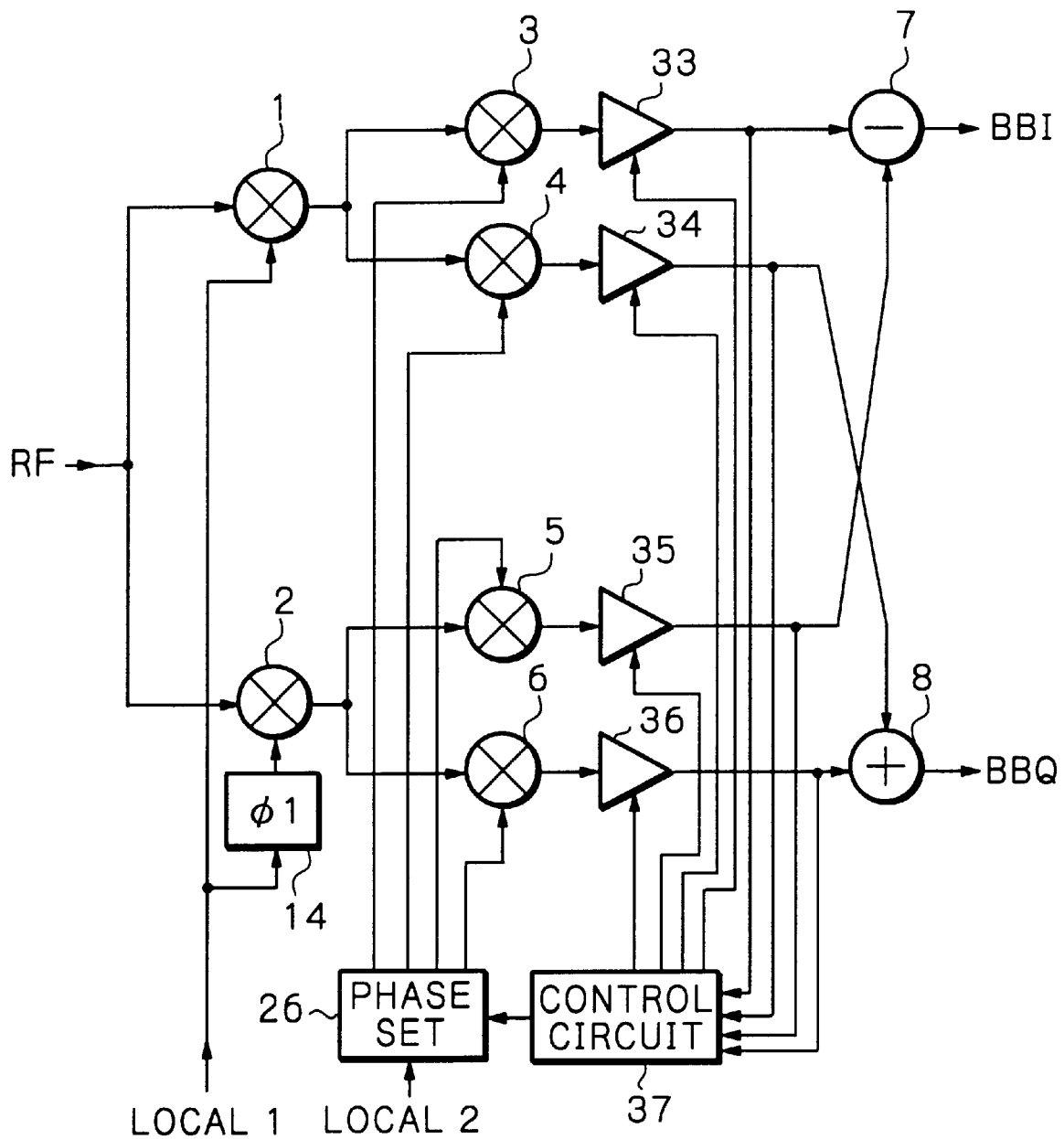
FIG. 8 is a block diagram of still another image-rejection receiver according to the present invention.
Figure 9:
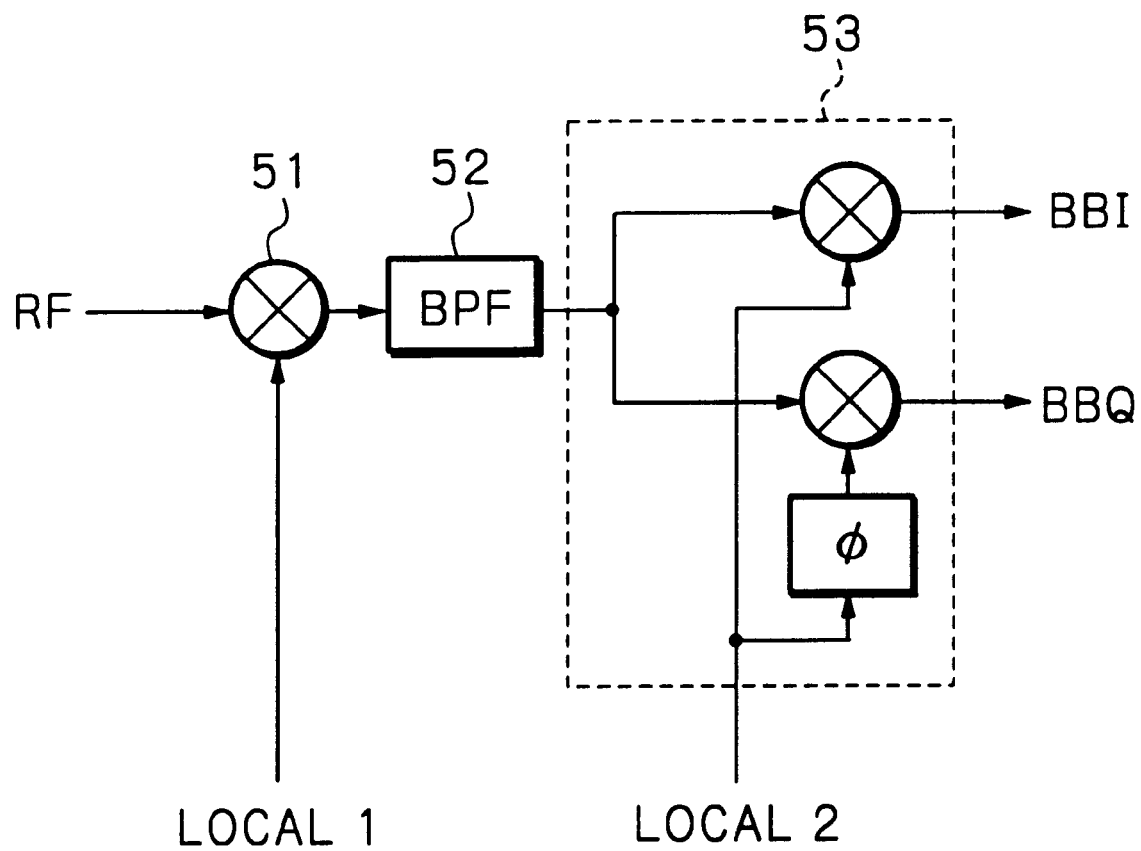
FIG. 9 is a prior super-heterodyne receiver.
Figure 10:
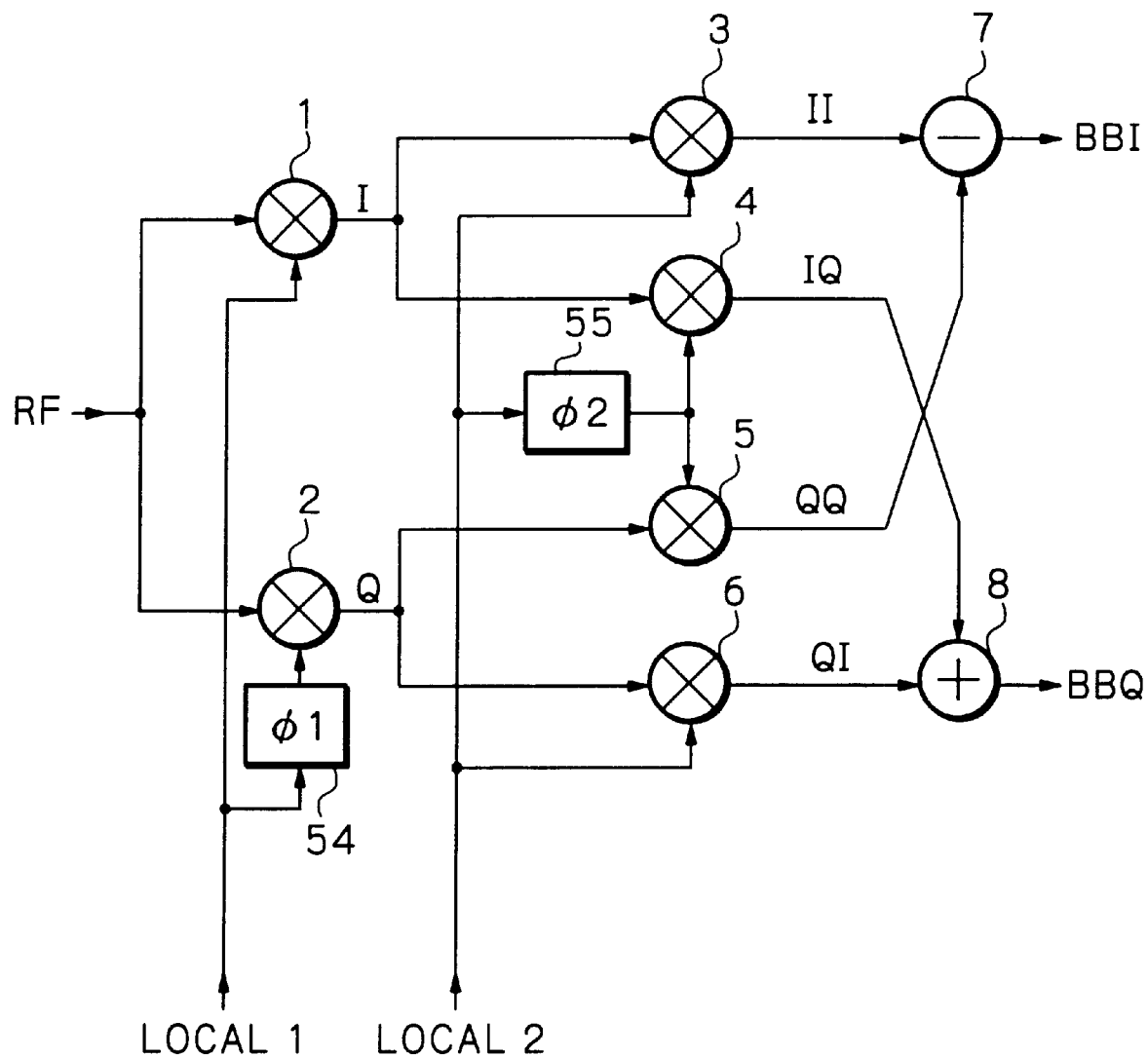
FIG. 10 is a prior image-rejection receiver.

FIG. 8 is a block diagram of still another embodiment of an image-rejection receiver according to the present invention. The feature of the embodiment of FIG. 8 is the presence of an amplitude compensation circuit attached to the embodiment of FIG. 6. The numerals 33 through 36 are a gain control amplifier which is controlled a gain by control signal of a control circuit 37. The control circuit 37 functions not only to control the phase set circuit 26 by measuring phase errors as described in accordance with the control circuit 27 in FIG. 6, but also to control the gain of the gain control amplifiers 33 through 36 by detecting outputs of those amplifiers so that the output amplitude of the amplifier 33 coincides with that of the amplifier 35, and the output amplitude of the amplifier 34 coincides with that of the amplifier 36.

Thus, each of a subtractor 7 and an adder 8 receives two input signals having the same amplitude and the same phase. Therefore, the outputs of the subtractor and the adder provide the BBI and BBQ, respectively, at the baseband with well suppressed image signal.

It should be appreciated that an amplitude compensation circuit in FIG. 8 may be combined with the embodiments of FIG. 1, FIG. 3, FIG. 4, FIG. 5 and FIG. 6.

As described above in detail, according to the present invention, an image-rejection receiver is provided by compensating phase error of a local signal, and/or compensating amplitude of signals to be added or subtracted.

From the foregoing, it will now be apparent that a new and improved image-rejection receiver has been found. It should be understood of course that the embodiments disclosed are merely illustrative and are not intended to limit the scope of the invention. Reference should be made, therefore, to the appended claims to indicate the scope of the invention.

What is claimed is:

1. An image-rejection receiver comprising;
a first mixer receiving an input radio frequency signal and a first local frequency signal to provide sum and difference frequencies of those signals,
a second mixer receiving said input radio frequency signal and said first local frequency signal through a first variable phase shifter which shifts phase of said first local frequency signal by 90° to provide sum and difference frequencies of those signals,
a third mixer receiving an output of said first mixer and a second local frequency signal to provide sum and difference frequencies of those signals,
a fourth mixer receiving said output of said first mixer and output of said second local frequency signal through a second variable phase shifter which shifts phase of said second local signal by 90° to provide sum and difference frequencies of those signals,
a fifth mixer receiving an output of said second mixer and said output of said second variable phase shifter to provide sum and difference frequencies of those signals,
a sixth mixer receiving said output of said second mixer and said second local frequency signal to provide sum and difference frequencies of those signals,
a subtractor for providing difference between amplitude of an output of said third mixer and amplitude of an output of said fifth mixer as inphase component BBI,
an adder for providing sum of amplitude of an output of said fourth mixer and amplitude of an output of said sixth mixer as quadrature-phase component BBQ, and
a control circuit receiving at least three of outputs of said 3'rd through 6'th mixers to provide a control signal of said first variable phase shifter and said second variable phase shifter so that phase shift by said phase shifters is controlled to be 90°.

2. An image-rejection receiver according to claim 1, wherein said control circuit provides a control signal of said first variable phase shifter by D.C. component of a product of outputs of said third mixer and said sixth mixer, and a control signal of said second variable phase shifter by D.C. component of a product of outputs of said third mixer and said fourth mixer.

3. An image-rejection receiver comprising;
a first mixer receiving an input radio frequency signal and a first local frequency signal to provide sum and difference frequencies of those signals,
a second mixer receiving said input radio frequency signal and said first local frequency signal through a first phase shifter which shifts phase of said first local frequency signal by 90° to provide sum and difference frequencies of those signals,
a third mixer receiving an output of said first mixer and a phased second local frequency signal to provide sum and difference frequencies of those signals,
a fourth mixer receiving said output of said first mixer and a phased second local frequency signal to provide sum and difference frequencies of those signals,
a fifth mixer receiving an output of said second mixer and a phased second local frequency to provide sum and difference frequencies of those signals, a sixth mixer receiving said output of said second mixer and a phased second local frequency to provide sum and difference frequencies of those signals, a subtractor for providing difference between amplitude of an output of said third mixer and amplitude of an output of said fifth mixer as inphase component BBI, an adder for providing sum of amplitude of an output of said fourth mixer and amplitude of an output of said sixth mixer as quadrature-phase component BBQ, a phase set circuit receiving a second local frequency signal and shifting phase of said second local frequency signal to provide phased second local frequencies to said third, fourth, fifth and sixth mixers, and a control circuit receiving an output of said 3'rd through 6'th mixers to measure phase error of said first phase shifter from 90° and phases of said phased second local frequency signals supplied by said phase set circuit, and to provide a control signal to said phase set circuit so that the phased second local frequencies are supplied to said 3'rd through 6'th mixers to compensate the phase error of said first phase shifter from 90°.

4. An image-rejection receiver according to claim 3, wherein;
said phase set circuit provides second local frequency signal with no phase shift to said third mixer and said sixth mixer, has a second variable phase shifter for providing 90° phase shifted second local frequency signal to said fourth mixer, and a third variable phase shifter for providing 90° phase shifted second local frequency signal to said fifth mixer, and said control circuit controls said second variable phase shifter so that amount of phase error from 90° of said second variable phase shifter is equal to an amount of phase error from 90° of said first phase shifter but in opposite sign, and phase error from 90° of said third variable phase shifter is equal to phase error from 90° of said first phase shifter.

5. An image-rejection receiver according to claim 4, wherein said control circuit measures phase error from 90° of said first phase shifter by D.C. component of a product of outputs of said third mixer and said sixth mixer, phase error from 90° of said second variable phase shifter by D.C. component of a product of outputs of said third mixer and said fourth mixer, and phase error from 90° of said third variable phase shifter by D.C. component of a product of outputs of said fifth mixer and said sixth mixer.

6. An image-rejection receiver according to claim 3,
said phase set circuit provides second local frequency signal with no phase shift to said third mixer and said sixth mixer, has a second variable phase shifter for providing 90° phase shifted second local frequency signal, a third phase shifter coupled with an output of said second variable phase shifter to provide a phased second local frequency signal to said fourth mixer, and a fourth variable phase shifter coupled with an output of said second variable phase shifter to provide a phased second local frequency signal to said fifth mixer, said control circuit controls said second variable phase shifter so that phase error from 90° of said second variable phase shifter is zero, an amount of phase error from 0° of said third variable phase shifter is equal to an amount of phase error from 90° of said first phase shifter but in opposite sign, and phase error from 0° of said fourth variable phase shifter is equal to phase error from 90° of said first phase shifter.

7. An image-rejection receiver according to claim 6, wherein said control circuit measures phase error from 90° of said second variable phase shifter by D.C. component of a product of outputs of said third mixer and said fourth mixer assuming that phase shift by said third variable phase shifter and said fourth variable phase shifter is zero, phase error from 90° of said third variable phase shifter by D.C. component of a product of outputs of said third mixer and said sixth mixer, and phase error of said fourth variable phase shifter by D.C. component of a product of outputs of said fifth mixer and said sixth mixer.

8. An image-rejection receiver according to claim 3, wherein;
said phase set circuit provides second local frequency signal with no phase shift to said third mixer, has a second variable phase shifter for providing 90° phase shifted second local frequency signal to said fourth mixer, a third variable phase shifter to provide a phased second local frequency signal to said sixth mixer, and a fourth variable phase shifter coupled with an output of said second variable phase shifter to provide a phased second local frequency signal to said fifth mixer, said control circuit controls said second variable phase shifter so that phase error from 90° of said second variable phase shifter is zero, and phase error from 0° of said third variable phase shifter and said fourth variable phase shifter is equal to phase error from 90° of said first phase shifter.

9. An image-rejection receiver according to claim 8, wherein said control circuit measures phase error from 90° of said second variable phase shifter by D.C. component of a product of outputs of said third mixer and said fourth mixer, and measures phase error from 90° of said first phase shifter and phase error from 0° of said third variable phase shifter and said fourth variable phase shifter by D.C. component of difference of a product of outputs of said third mixer and said sixth mixer, and a product of outputs of said fourth mixer and said fifth mixer.

10. An image-rejection receiver according to any one of preceding claims, further comprises a first, a second, a third and a fourth gain controllable amplifiers at an output of said third, fourth, fifth and sixth mixers, respectively, and said control circuit measures amplitudes of said gain controllable amplifiers and controls said gain controllable amplifiers so that amplitude of output signal of said first gain controllable amplifier is the same as that of said third gain controllable amplifier, and amplitude of output signal of said second gain controllable amplifier is the same as that of said fourth gain controllable amplifier.

\* \* \* \* \*